United States Patent
Hashimoto et al.

(10) Patent No.: US 8,441,619 B2
(45) Date of Patent: May 14, 2013

(54) PHOTODETECTOR AND SPATIAL INFORMATION DETECTING DEVICE USING THE SAME

(75) Inventors: Yusuke Hashimoto, Neyagawa (JP); Fumi Tsunesada, Ibaraki (JP); Kenji Imai, Kadoma (JP); Yuji Takada, Kyoto (JP)

(73) Assignee: Panasonic Corporation, Osaka (JP)

( * ) Notice: Subject to any disclaimer, the term of this patent is extended or adjusted under 35 U.S.C. 154(b) by 639 days.

(21) Appl. No.: 12/448,615

(22) PCT Filed: Dec. 27, 2007

(86) PCT No.: PCT/JP2007/075413
§ 371 (c)(1),
(2), (4) Date: Jan. 8, 2010

(87) PCT Pub. No.: WO2008/081997
PCT Pub. Date: Jul. 10, 2008

(65) Prior Publication Data
US 2010/0141927 A1  Jun. 10, 2010

(30) Foreign Application Priority Data
Dec. 29, 2006  (JP) .................................. 2006-356754

(51) Int. Cl.
*G01C 3/08*  (2006.01)
(52) U.S. Cl.
USPC ......... 356/4.01; 356/3.01; 356/4.1; 356/5.01; 356/5.1
(58) Field of Classification Search ........ 356/3.01–3.15, 356/4.01–4.1, 5.01–5.15, 6–22, 28, 28.5, 356/139.01–139.1
See application file for complete search history.

(56) References Cited

U.S. PATENT DOCUMENTS 4,873,561 A * 10/1989 Wen ................................ 377/62
4,975,777 A * 12/1990 Lee et al. ....................... 348/314
(Continued)

FOREIGN PATENT DOCUMENTS

DE  195 19 743  12/1995
EP  1 944 571 A1  7/2008
(Continued)

OTHER PUBLICATIONS

Notice to Submit a Response for Korean Patent Application No. 10-2009-7013646 issued Jan. 3, 2011.
(Continued)

*Primary Examiner* — Luke Ratcliffe
(74) *Attorney, Agent, or Firm* — Edwards Wildman Palmer LLP; James E. Armstrong, IV; Stephen D. LeBarron

(57) ABSTRACT

A photodetector capable of improving dynamic range for input signals is provided. This photodetector includes a photoelectric converting portion, a charge separating portion, a charge accumulating portion, a barrier electrode formed the charge separating portion and the charge accumulating portion, and a barrier-height adjusting portion electrically connected to the barrier electrode. Undesired electric charges such as generated when environment light is incident on the photoelectric converting portion are removed by the charge separating portion. A potential barrier with an appropriate height is formed under the barrier electrode by applying a voltage to the barrier electrode according to an electric charge amount supplied from the charge separating portion to the barrier-height adjusting portion. Electric charges flowing from the charge separating portion into the charge accumulating portion over the potential barrier are provided as an output of the photodetector.

13 Claims, 8 Drawing Sheets

U.S. PATENT DOCUMENTS

| | | | |
|---|---|---|---|
| 5,276,520 A | 1/1994 | Hawkins et al. | |
| 5,602,407 A | 2/1997 | Washkurak et al. | |
| 5,900,927 A * | 5/1999 | Hasegawa | 356/3.13 |
| 2002/0057356 A1 | 5/2002 | Tanabe | |
| 2005/0178946 A1 | 8/2005 | Hashimoto et al. | |
| 2007/0045669 A1 | 3/2007 | Tsunai | |

FOREIGN PATENT DOCUMENTS

| | | |
|---|---|---|
| JP | 05-226630 A | 9/1993 |
| JP | 7-22436 | 1/1995 |
| JP | 7-22437 | 1/1995 |
| KR | 2004-102182 A | 6/2005 |
| WO | WO-90/16083 | 12/1990 |
| WO | WO-92/22091 | 12/1992 |

OTHER PUBLICATIONS

European Official Action dated Dec. 4, 2009 issued in European Patent Application No. 07 860 608.4.

International Search Report and Written Opinion mailed Jul. 11, 2008, issued in PCT/JP2007/075413.

Office Action issued Feb. 14, 2012 in connection with Japanese Application No. 2006-356754.

* cited by examiner

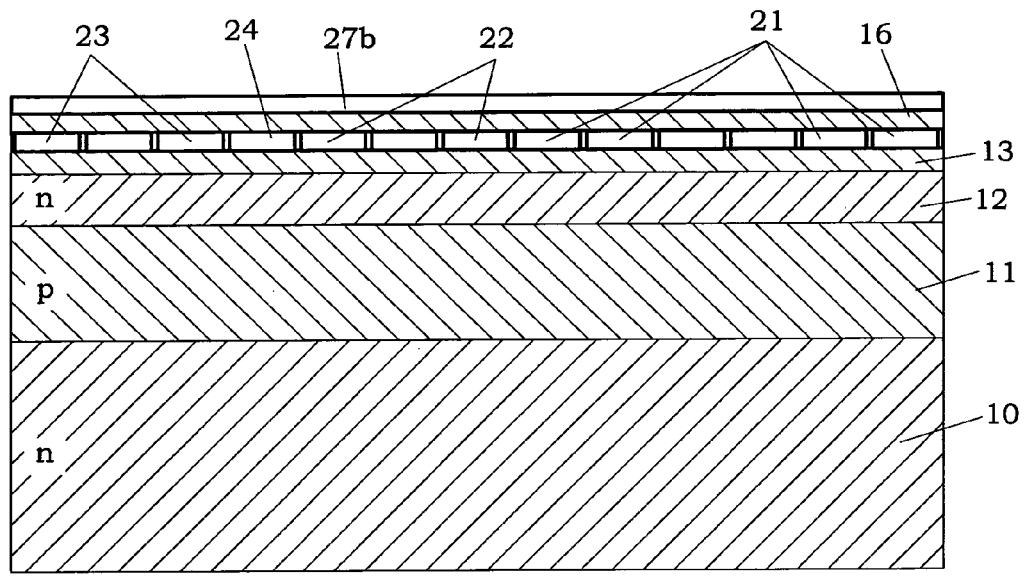
FIG. 3
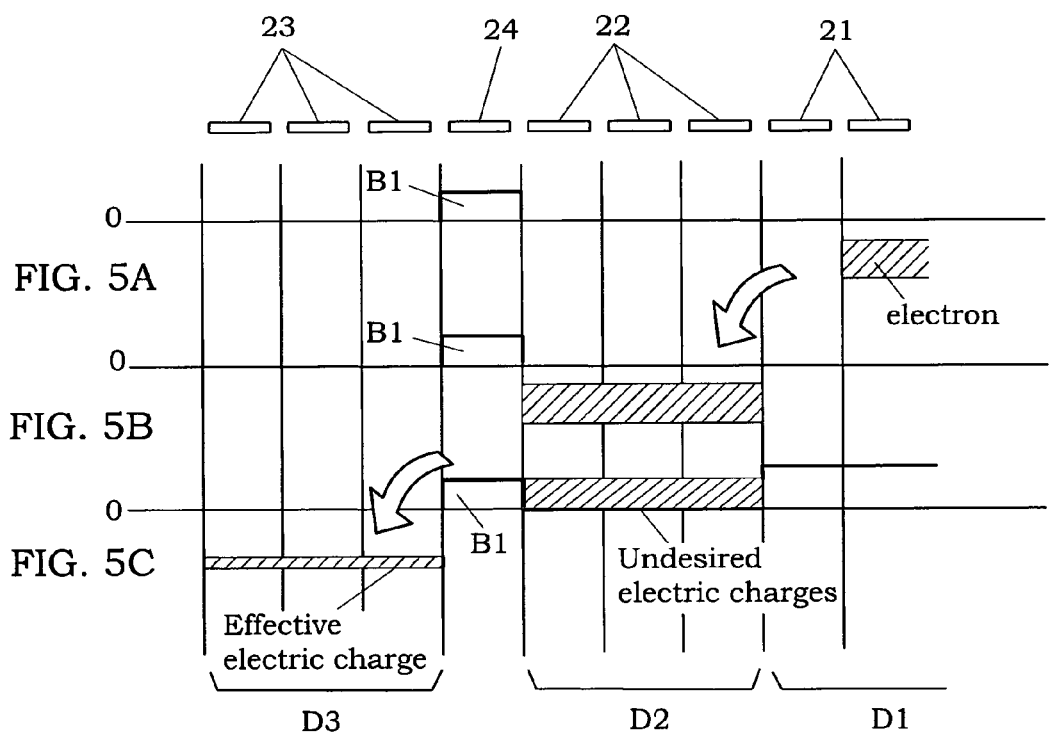

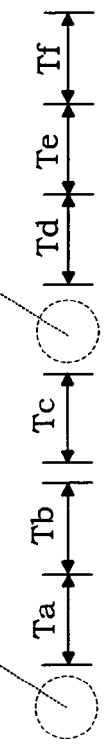
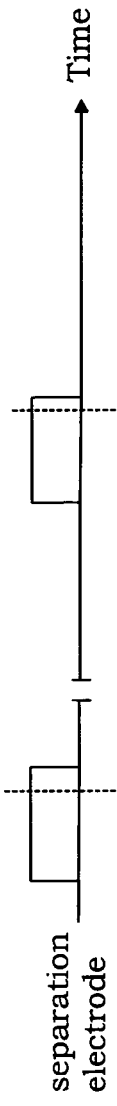
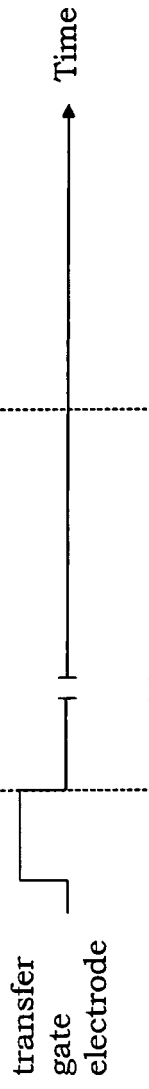
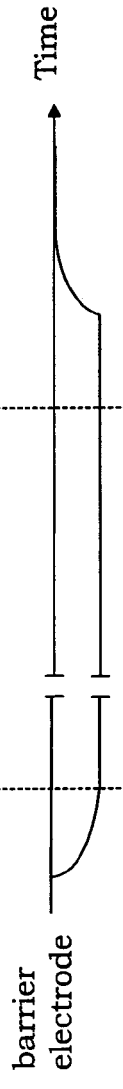
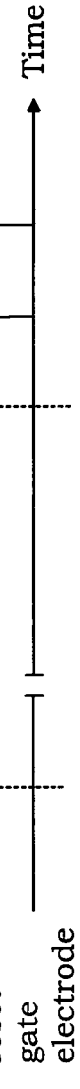
FIG. 4A  separation electrode
FIG. 4B  transfer gate electrode
FIG. 4C  drain electrode
FIG. 4D  barrier electrode
FIG. 4E  accumulation electrode
FIG. 4F  reset gate electrode

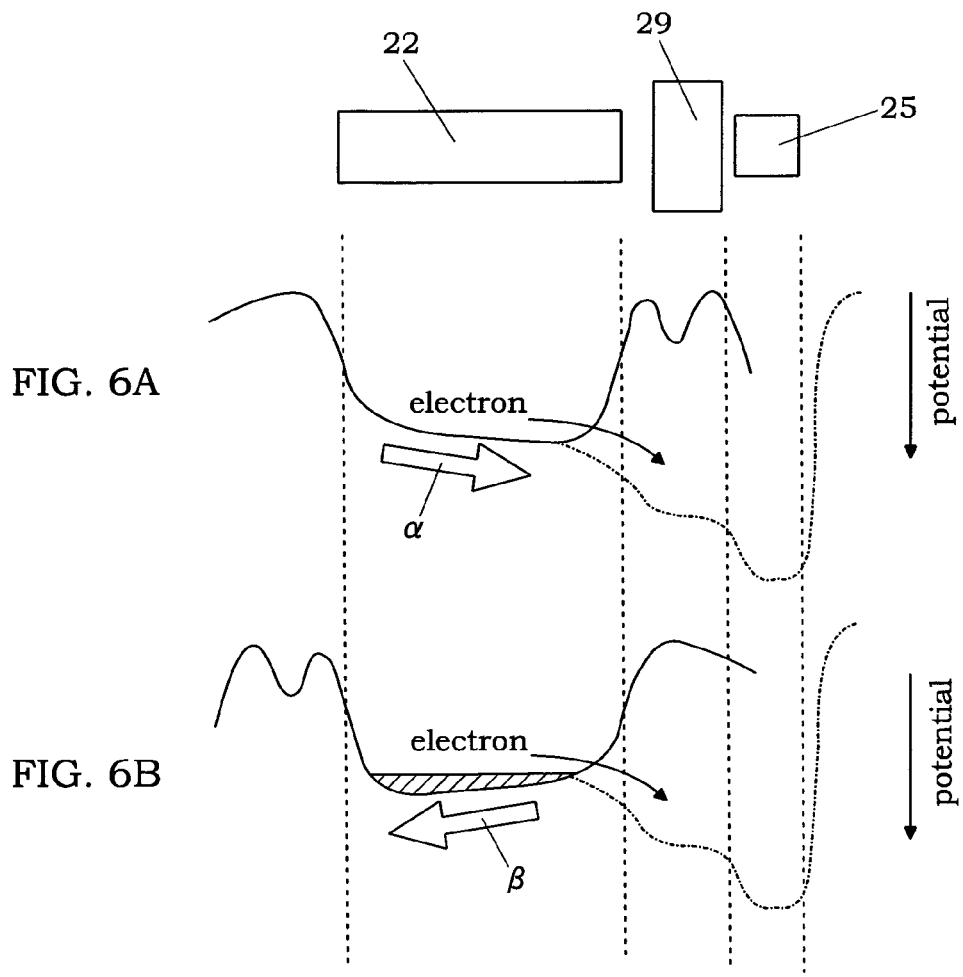
FIG. 6A
FIG. 6B
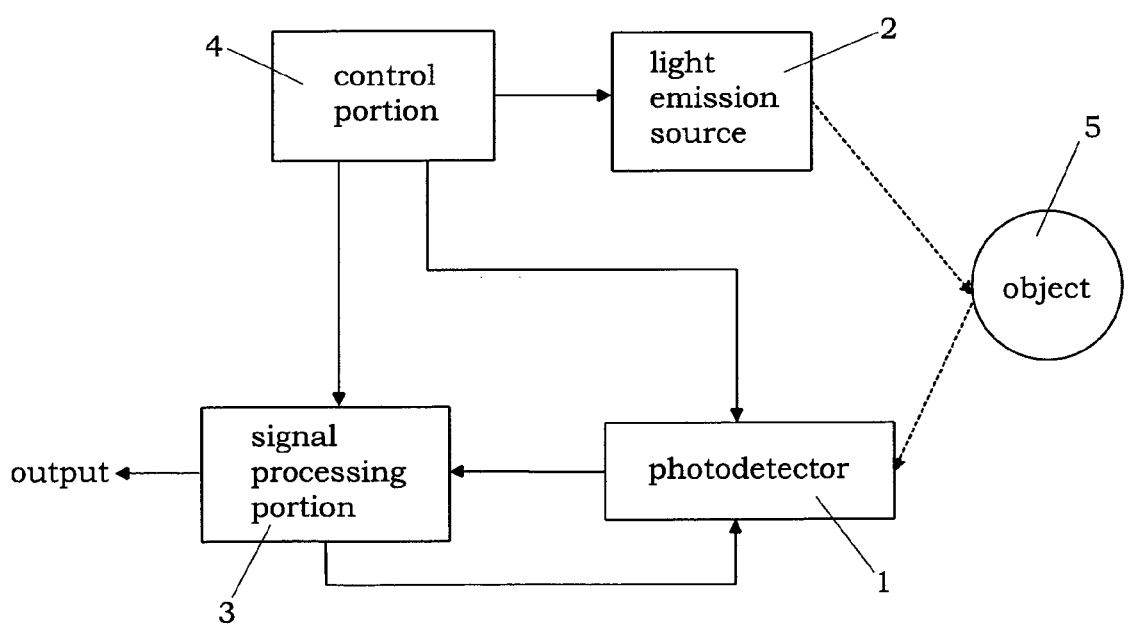
FIG. 7

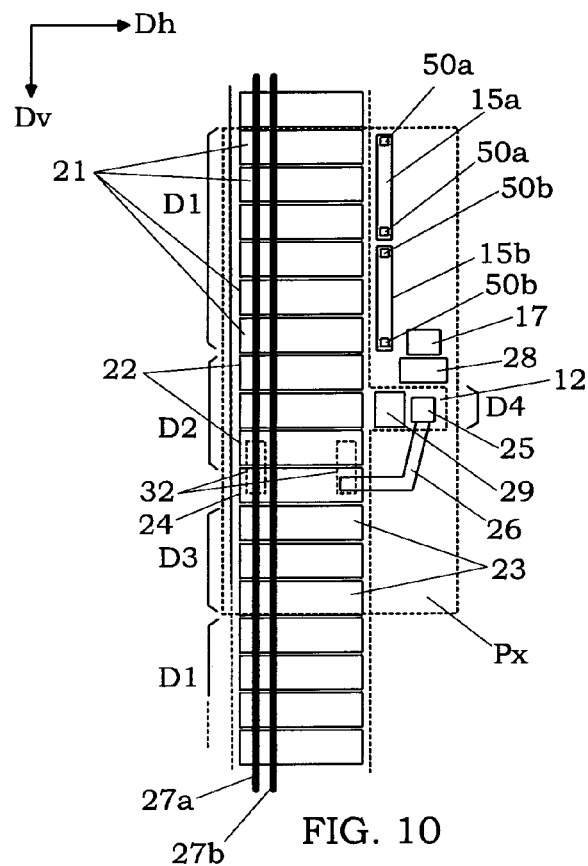
FIG. 10
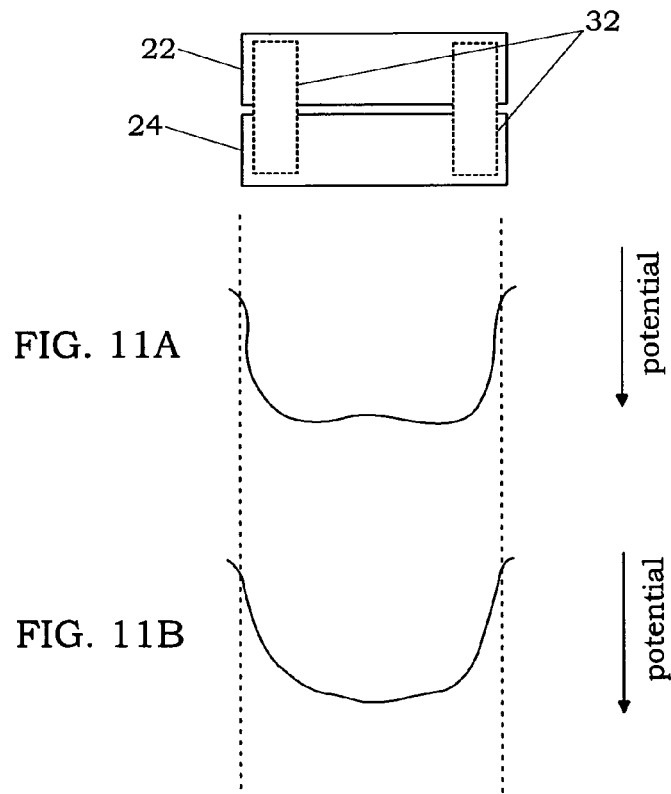
FIG. 11A
FIG. 11B

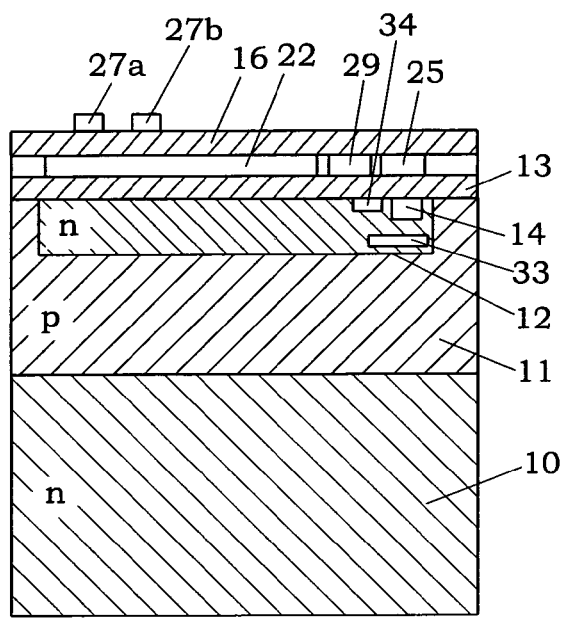
FIG. 12
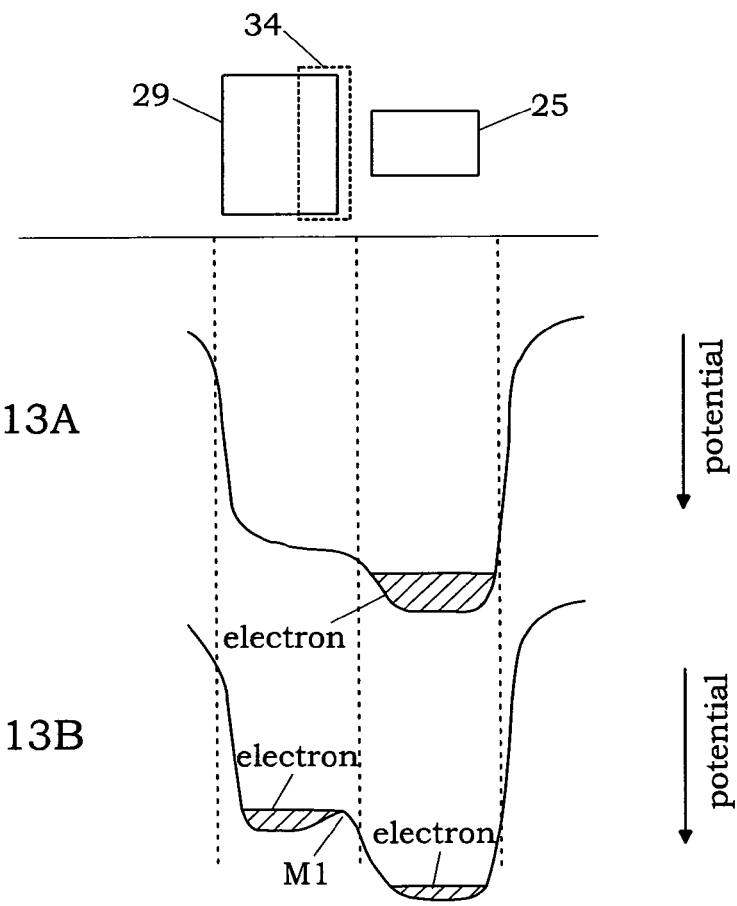
FIG. 13A
FIG. 13B

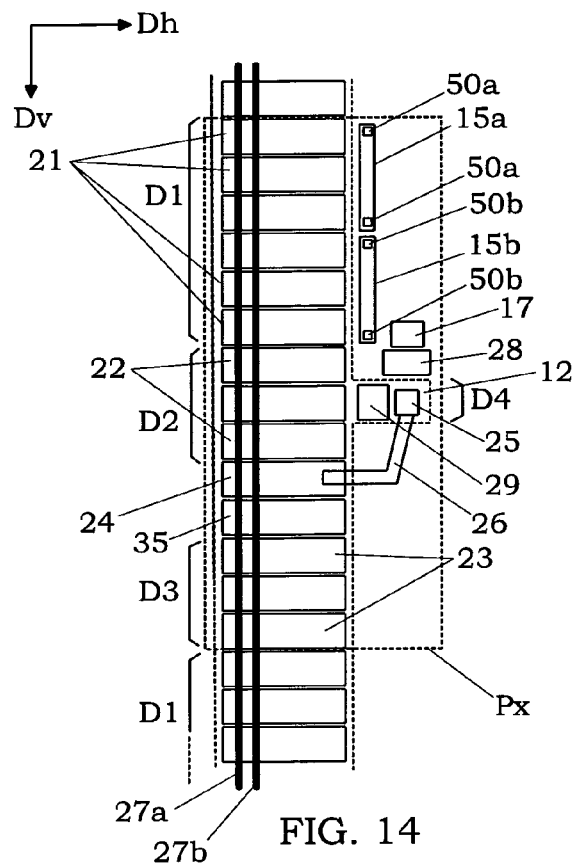
FIG. 14
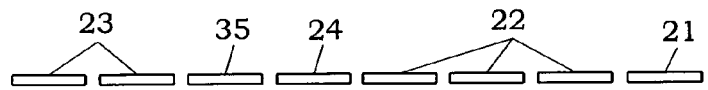
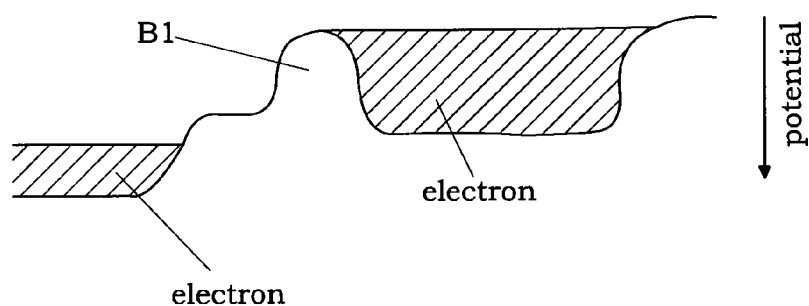
FIG. 15A
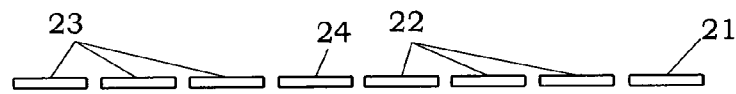
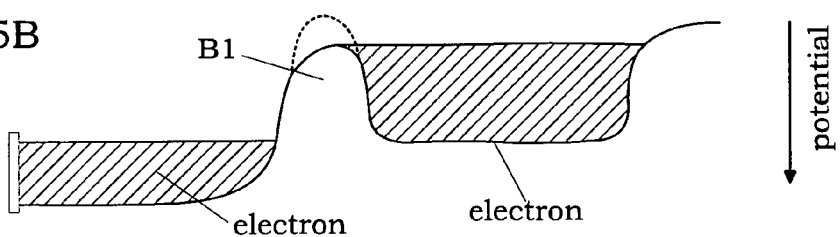
FIG. 15B

PHOTODETECTOR AND SPATIAL INFORMATION DETECTING DEVICE USING THE SAME

TECHNICAL FIELD

The present invention relates to a photodetector and a spatial information detecting device for detecting spatial information such as distance to an object in a target space by use of the photodetector.

BACKGROUND ART

A photodetector is a device for receiving light from a target space, generating electric charges corresponding to the received light amount, and taking out the electric charges as a received light output. To obtain a wide dynamic range in this kind of device, it has been proposed to remove, as undesired electric charges, a constant amount of electric charges in a charge transmission channel of a CCD device, and use the remaining electric charges other than the undesired electric charges as effective electric charges for the received light output.

For example, Japanese Patent Early Publication No. 7-22436 or 7-22437 discloses an electric charge transfer device capable of expanding a dynamic range, while keeping the linearity of voltage-electric charge conversion characteristics. This device is provided with a voltage-electric charge conversion means for converting an input voltage into a corresponding amount of electric charges at every cycle of a periodical pulse signal, a plurality of accumulation regions for accumulating the converted electric charges, a charge transfer means for transferring the electric charges from one of the accumulation regions to an adjacent accumulation region. This device also has a first storage region for accumulating a constant amount of electric charges, and a second storage region for accumulating electric charges overflowing from the first storage region, and transferring the electric charges to the charge transfer means. The first storage region has a potential well formed adjacent to the one of the accumulation regions, and a potential barrier provided between the second storage region and the potential well.

According to this device, the constant amount of electric charges in the electric charges converted at every cycle of the periodical pulse signal by the voltage-electric charge conversion means is separated by use of the potential well and the potential barrier, and then returned to the voltage-electric charge conversion means. At the same time, the remaining electric charges in the electric charges converted by the voltage-electric charge conversion means are transferred by the charge transfer means. However, since this device uses the mechanism that the constant amount of electric charges is returned as undesired electric charges to the voltage-electric charge conversion means, the amount of the undesired electric charges cannot be controlled in consideration of a change in received light amount.

By the way, it has been known from the past that the photodetector is used for a spatial information detecting device. In the spatial information detecting device, light is projected from a light emission source into a target space, and a reflected light from the target space is received by the photodetector. According to the received light output of the photodetector, spatial information such as a distance to an object in a target space, reflectance of the object, and light transmission in the target space can be detected. When this detecting device is used to detect the spatial information from the target space, in which environment light fluctuates with time, the fluctuation component of the environment light is contained in the received light output of the photodetector. Since this means that an amount of undesired electric charges depending upon the environment light condition, it is impossible to accurately take out the effective electric charges needed to determine the spatial information from the received light output of the photodetector by only separating the constant amount of electric charges as the undesired electric charges, as in the case of the above-mentioned prior art.

Thus, from the viewpoint of stably obtaining a wide dynamic range and achieving an improvement in detection accuracy even under the environment light, which fluctuates with time, the conventional photodetector still has plenty of room for improvement.

SUMMARY OF THE INVENTION

Therefore, a primary concern of the present invention is to provide a photodetector, which is capable of adjusting an amount of undesired electric charges to be discarded in consideration of the surrounding environment light, thereby improving a dynamic range for input signals.

That is, the photodetector of the present invention comprises a semiconductor substrate; a photoelectric converting portion formed in the semiconductor substrate to generate electric charges corresponding to a received light amount; a charge separating portion having a separation electrode formed on a general surface of the semiconductor substrate; a charge accumulating portion having an accumulation electrode formed on the general surface of the semiconductor substrate; a barrier electrode formed on the general surface of the semiconductor substrate between the separation electrode and the accumulation electrode; a barrier-height adjusting portion electrically connected to the barrier electrode; and a charge discarding portion. The charge separating portion is configured to separate undesired electric charges from the electric charges generated by the photoelectric converting portion by use of a potential barrier, which is formed in the semiconductor substrate under the barrier electrode by applying a voltage to the barrier electrode. The barrier-height adjusting portion determines the voltage applied to the barrier electrode according to an electric charge amount supplied from the photoelectric converting portion to adjust a height of the potential barrier. The charge accumulating portion is configured to accumulate effective electric charges that are electric charges flowing from the charge separating portion into the charge accumulating portion over the potential barrier. The charge discarding portion is configured to discard the undesired electric charges separated by the charge separating portion. The effective electric charges accumulated in the charge accumulating portion are provided as an output (received light output) of the photodetector. From the viewpoint of achieving an efficient layout of the photoelectric converting portion, the charge separating portion, the barrier-height adjusting portion and the charge discarding portion, and therefore downsizing the photodetector, it is particularly preferred that the barrier-height adjusting portion determines the voltage applied to the barrier electrode according to the electric charge amount supplied from the photoelectric converting portion through the charge separating portion, as described in preferred embodiments of the present invention.

According to the present invention, since the height of the potential barrier formed under the barrier electrode is determined according to the electric charge amount supplied from the photoelectric converting portion into the barrier-height adjusting portion preferably through the charge separating portion, it is possible to control the electric charge amount to be separated as the undesired electric charges. For example, when only environment light is incident on the photodetector, an amount of electric charges corresponding to the received environment light is generated by the photoelectric converting portion. The generation amount of the electric charges changes depending on the environment light condition. The barrier-height adjusting portion receives the electric charges generated by the environment light from the photoelectric converting portion preferably through the charge separating portion, and determines the voltage applied to the barrier electrode such that the potential barrier has an appropriate height to the environment light condition. Thus, the photodetector can be prevented from saturation by controlling the amount of the undesired electric charges depending on the environment light condition. In addition, since the photodetector has the charge discarding portion, it is possible to always accurately separate the undesired electric charges by the charge separating portion. Consequently, the photodetector of the present invention has the capability of ensuring a wide dynamic range for input signals, and reliably providing the received light output.

It is preferred that the photoelectric converting portion comprises a plurality of sensitivity control electrodes formed on the general surface of the semiconductor substrate, and a potential well having a desired aperture area is formed in the semiconductor substrate by controlling a voltage applied to each of the sensitivity control electrodes. In this case, it becomes possible to control the sensitivity of the photoelectric converting portion according to the aperture area of the potential well. That is, when controlling the timing of applying the voltage to the respectively sensitivity control electrodes and the applied voltage value, it is possible to control the photodetector such that the electric charges corresponding to the received light amount obtained in a prescribed period are easily collected in the potential well of the photoelectric converting portion, and the electric charges corresponding to the received light amount obtained in the other period are hardly collected in the potential well. In addition, when the potential well is controlled to have a small aperture area in the other period, the electric charges collected at the prescribed period can be held in the potential well in the other period. Therefore, by alternately repeating a charge accumulation period and a charge holding period, the electric charges corresponding to the received light amount of the prescribed period can be collected in a cumulative manner by the photoelectric converting portion. Specifically, when the intensity of light incident on the photoelectric converting portion is periodically changed, it is possible to integrate the electric charges corresponding to the received light amount in a specific phase zone by accumulating the electric charges generated in the specific phase zone at every period.

As a preferred embodiment of the present invention, the barrier electrode is formed on the semiconductor substrate through an insulating layer. The photoelectric converting portion, the charge separating portion, the barrier electrode and the charge accumulating portion are aligned in a row. The barrier-height adjusting portion and the charge discarding portion are provided at one side of the row such that the barrier-height adjusting portion is positioned adjacent to the charge separating portion, and the charge discarding portion is positioned adjacent to the photoelectric converting portion. In this case, a potential gradient can be formed in a direction of flowing the electric charges from the charge separating portion toward the barrier-height adjusting portion according to the potential relation among the charge separating portion, the barrier-height adjusting portion and the charge discarding portion. Consequently, it is possible to reliably supply the electric charges from the charge separating portion to the barrier-height adjusting portion, and accurately determine the height of the potential barrier according to the electric charge amount in the barrier-height adjusting portion.

As another preferred embodiment of the present invention, the photodetector has a pair of slit regions formed in the semiconductor substrate so as to straddle between the separation electrode and the barrier electrode, and spaced from each other in a direction orthogonal to the row. The slit regions have a same conductive type as another region other than the slit regions, which straddles between the separation electrode and the barrier electrode. In addition, the slit regions have a higher impurity concentration than the another region. In this case, since both end portions of the potential barrier in the direction orthogonal to the row, i.e., rising edges of the potential barrier are sharply formed by the slit regions, it becomes possible to prevent an undesired leakage of the electric charges from the charge separating portion to the charge accumulating portion, and consequently accurately separate the undesired electric charges by the charge separating portion. In addition, there is another advantage that non-linearity of volume change relative to the applied voltage can be moderated by the formation of the slit regions, so that the electric charge amount in the barrier-height adjusting portion is substantially proportional to the amount of the undesired electric charges.

It is also preferred that the photodetector has a buffer electrode formed on the general surface of the semiconductor substrate between the barrier electrode and the accumulation electrode, and a voltage applied to the buffer electrode is controlled such that a potential developed in the semiconductor substrate under the buffer electrode is between a potential developed in the semiconductor substrate under the barrier electrode and a potential developed in the semiconductor substrate under the accumulation electrode. In this case, it is possible to prevent that the height of the potential barrier is influenced by the electric charge amount accumulated in the charge accumulating portion. That is, the potential can be stably maintained in the vicinity of the potential barrier by the buffer electrode. Therefore, even when the electric charge amount in the charge accumulating portion fluctuates, the influence on the potential barrier can be prevented.

The photodetector of the present invention preferably has a barrier layer formed in the semiconductor substrate under the barrier-height adjusting portion to block a movement of electric charges from a deep portion of the semiconductor substrate into the barrier-height adjusting portion. In this case, it is possible to prevent that noise electric charges such as the electric charges generated at the deep portion of the semiconductor substrate by light irradiation are mixed in the barrier-height adjusting portion.

As a further preferred embodiment of the present invention, the photodetector further comprises a transfer gate electrode formed on the general surface of the semiconductor substrate between the charge separating portion and the barrier-height adjusting portion, and a potential adjusting portion formed adjacent to the barrier-height adjusting portion. A charge transfer channel is formed in the semiconductor substrate under the transfer gate electrode and between the charge separating portion and the barrier-height adjusting portion by controlling a voltage applied to the transfer gate electrode. The potential adjusting portion has an impurity concentration controlled such that electric charges move in the charge transfer channel from the charge separating portion toward the barrier-height adjusting portion. In this case, since the movement of the electric charges from the charge separating portion toward the barrier-height adjusting portion is controlled by changing the voltage applied to the transfer gate electrode, it is possible to prevent an undesired leakage of electric charges from the charge separating portion into the barrier-height adjusting portion at the time of separating the undesired electric charges by the charge separating portion. In addition, the potential adjusting portion prevents that a potential change occurs in the charge transfer channel so as to inhibit the movement of the electric charges from the charge separating portion into the barrier-height adjusting portion. Consequently, it is possible to stably obtain a potential gradient for smoothly moving the electric charges from the charge separating portion toward the barrier-height adjusting portion through the charge transfer channel.

In addition, it is preferred that the charge discarding portion is located in the vicinity of the photoelectric converting region and the charge separation region to discard excess electric charges from the photoelectric converting portion as well as the undesired electric charges from the charge separation region. By discarding the excess electric charges, it becomes possible to more accurately obtain the received light output corresponding to a change in the received light amount. More preferably, the charge discarding portion comprises a first charge discarding portion configured to discard the excess electric charges, and a second charge discarding portion configured to discard the undesired electric charges. In this case, it is further preferred that charge discarding portion is controlled such that a timing of discarding the excess electric charges from the photoelectric converting portion through the first charge discarding portion is different from the timing of discarding the undesired electric charges from the charge separating portion through the second charge discarding portion. There is an advantage that the discarding operation of the excess electric charges of the photoelectric converting portion can be independently performed from the discarding operation of the undesired electric charges of the charge separating portion.

In the photodetector of the present invention, it is preferred that a plurality of pixels are formed on the semiconductor substrate, each of which comprises the photoelectric converting portion, the charge separating portion, the charge accumulating portion, the barrier-height adjusting portion and the barrier electrode. In this case, it is possible to control the amount of the undesired electric charges with respect to each of the pixels, and thereby prevent each of the pixels from saturation.

Another concern of the present invention is to provide a spatial information detecting device using the photodetector described above. That is, this detecting device comprises a light emission source configured to intermittently project light into a target space; the photodetector as set forth in of claim 1, which is disposed to receive light from the target space; a control portion configured to control light emission of the light emission source, and voltages applied to the separation electrode, the accumulation electrode and the charge discarding portion of the photodetector; and a signal processing portion configured to extract spatial information of the target space from an output of the photodetector. The control portion moves electric charges, which are generated by the photoelectric converting portion within a rest period where the light is not projected from the light emission source to the target space, into the barrier-height adjusting portion to form the potential barrier with a height determined according to the electric charge amount in the barrier-height adjusting portion. The charge separating portion removes the undesired electric charges from electric charges, which are generated by the photoelectric converting portion within a lighting period where the light is projected from the light emission source into the target space. The electric charges flowing from the charge separating portion into the charge accumulating portion over the potential barrier are accumulated as the effective electric charges in the charge accumulating portion. The undesired electric charges separated by the charge separating portion are discarded through the charge discarding portion prior to the rest period. The effective electric charges accumulated in the charge accumulating portion are provided as the output of the photodetector.

According to the spatial information detecting deice using the photodetector of the present invention, when the amount of the undesired electric charges to be separated by the charge separating portion can be automatically set according to the environment light condition. That is, the received light amount obtained in the lighting period is equivalent to a total of the received light amount resulting from the environment light and the received light amount resulting from the light (i.e., signal light) of the light emission source. On the other hand, the received light amount obtained in the rest period is equal to the received light amount resulting from the environment light. Therefore, by removing the electric charges corresponding to the received light amount obtained in the rest period as the undesired electric charges from the electric charges corresponding to the received light amount obtained in the lighting period, it is possible to eliminate the influence of the environment light, and efficiently obtain the effective electric charges corresponding to the received light amount of the signal light. Thus, the dynamic range for the signal light can be increased. In addition, since the undesired electric charges are discarded from the charge separating portion by the charge discarding portion prior to the rest period, it is possible to prevent that electric charges other than the electric charges corresponding to the environment light are accidentally mixed in the barrier-height adjusting portion.

As a preferred embodiment of the spatial information detecting device described above, the photoelectric converting portion has a plurality of sensitivity control electrodes on the general surface of the semiconductor substrate. The control portion sends a modulation signal to the light emission source such that light intensity-modulated at the modulation signal is projected into the target space within the lighting period, and also controls voltages applied to the sensitivity control electrodes such that an aperture area of a potential well formed in the semiconductor substrate under each of the sensitivity control electrodes changes at a timing synchronized with the modulation signal, thereby generating the electric charges corresponding to a phase zone of the modulation signal by the photoelectric converting portion. The signal processing portion detects a distance to an object in the target space as the spatial information from outputs of the photodetector, which are obtained at plural phase zones of the modulation signal. In this case, it becomes possible to determine a distance to the object in the target space as the spatial information by use of the received light outputs taken out from the plural phase zones.

Further characteristics of the present invention and advantages brought thereby will be clearly understood from the best mode for carrying out the invention described below.

BRIEF EXPLANATION OF THE DRAWINGS

FIG. 3 is a cross-sectional view of the photodetector taken along the line B-B in FIG. 1;

FIGS. 4A to 4F are operation explanatory diagrams of the photodetector;

FIGS. 5A to 5C are diagrams showing potential changes in the photodetector;

FIG. 6A is a diagram showing a potential change in the photodetector of the first embodiment, and FIG. 6B is a diagram showing a potential change in another photodetector;

FIG. 7 is a block diagram of a spatial information detecting device using the photodetector of the present invention;

FIG. 10 is a plan view of a relevant portion of a photodetector according to a third embodiment of the present invention;

FIG. 11A is a diagram showing a potential change in the photodetector of the third embodiment, and FIG. 11B is a diagram showing a potential change in another photodetector;

FIG. 12 is a cross-sectional view of a relevant portion of a photodetector according to a fourth embodiment of the present invention;

FIG. 13A is a diagram showing a potential change in the photodetector of the fourth embodiment, and FIG. 13B is a diagram showing a potential change in another photodetector;

FIG. 14 is a cross-sectional view of a relevant portion of a photodetector according to a fifth embodiment of the present invention; and FIG. 15A is a diagram showing a potential change in the photodetector of the fifth embodiment, and FIG. 15B is a diagram showing a potential change in another photodetector.

BEST MODE FOR CARRYING OUT THE INVENTION

The photodetector of the present invention and the spatial information detecting device using the same photodetector are explained below in detail according to preferred embodiments.

That is, as the photodetector of the present invention, a two dimensional image sensor is explained in the following embodiments. In this image sensor, a plurality of pixels are disposed along the vertical direction Dv to form a pixel row, and a plurality of the pixel rows are arranged in the horizontal direction Dh to obtain a matrix arrangement of the pixels. In the following embodiments, to facilitate the understanding of the present invention, a range equivalent to one pixel is explained. The technical concept of the present invention is also available in a device requiring the configuration equivalent to one pixel of the two dimensional image sensor, or a one dimensional (linear) image sensor having the plural pixels disposed in a single row.

In addition, as the spatial information detecting device of the present invention, a distance measuring device for determining a distance to an object in a target space is explained in the following embodiments. This distance measuring device is mainly formed with a light emission source, the photodetector of the present invention, and a signal processing portion for the received light output of the photodetector. The technical concept of the spatial information detecting device of the present invention is also applicable to determine another spatial information such as reflectance of the object or light transmission in the target space.

First Embodiment

Figure 1:
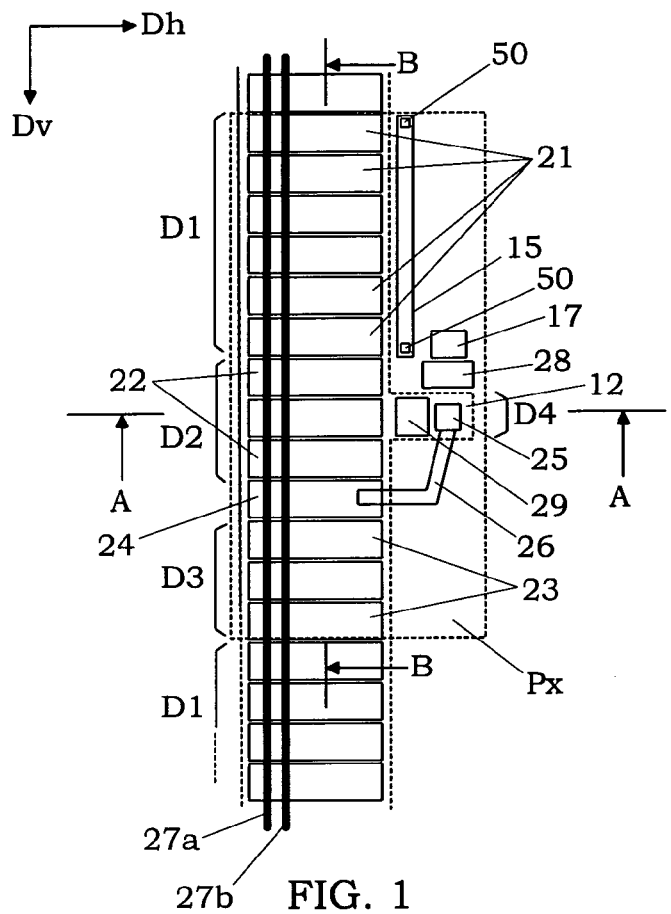
FIG. 1 is a plan view of a relevant portion of a photodetector according to a first embodiment of the present invention.
Figure 2:
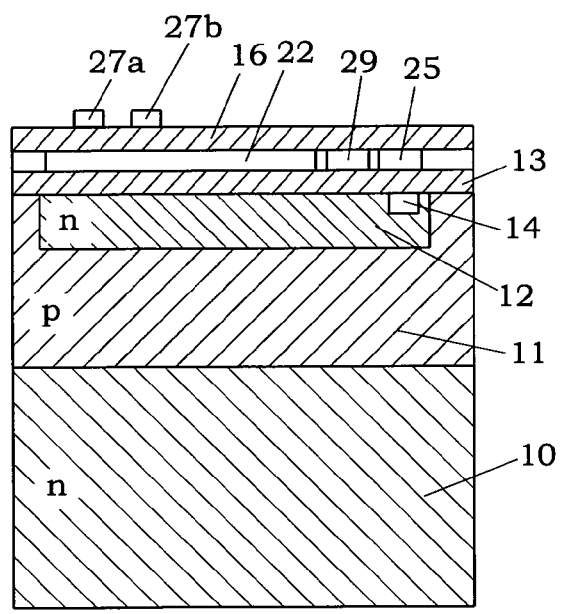
FIG. 2 is a cross-sectional view of the photodetector taken along the line A-A in FIG. 1.

FIG. 1 shows a region corresponding to one pixel Px of the photodetector. The pixel Px is, as shown in FIGS. 2 and 3, provided with a substrate 10, a device formation layer 11 formed on the substrate 10 by a semiconductor material (e.g., silicon) of a first conductive type (e.g., p-type), a well 12 formed over a required depth from the general surface (i.e., the top surface) of the device formation layer 11 by a semiconductor material of a second conductive type (e.g., n-type), an insulating layer 13 such as silicon oxide or silicon nitride formed on the general surface of the well 12 as well as the general surface of the device formation layer 11, and electrodes disposed on the insulating layer 13. As shown in FIG. 3, the electrodes comprise sensitivity control electrodes 21, separation electrodes 22, accumulation electrodes 23, and a barrier electrode 24. In this embodiment, the substrate 10 is formed by a semiconductor material of the second conductive type (i.e., n-type). In the well 12, a charge holding well 14 is formed, which is a well of the second conductive type having a higher impurity concentration (i.e., n++ type) than the well 12. An ohmic connection is formed between the charge holding well 14 and an end portion 25 of a connection line 26, and the other end of the connection line 26 is connected to the barrier electrode 24. Alternatively, an electrode may be formed at one end of the connection line 26 so as to be positioned above the charge holding well 14 through the insulating layer 13.

In the plan view, each of the sensitivity control electrodes 21, the separation electrodes 22, the accumulation electrodes 23 and the barrier electrode 24 is configured in a substantially rectangular shape. In addition, these electrodes have substantially same dimensions, and are arranged in a row along a width direction of the respective electrodes. That is, these electrodes are arranged in substantially parallel to each other in the longitudinal direction orthogonal to the width direction. In this embodiment, the with direction is defined as the vertical direction Dv of the pixel arrangement, and the longitudinal direction is defined as the horizontal direction Dh of the pixel arrangement. In addition, one pixel Px of the photodetector of the present embodiment is composed of six sensitivity electrodes 21, three separation electrodes 22, single barrier electrode 24 and three accumulation electrodes 23. These electrodes may be formed in different shapes or with different dimensions from each other. As an example, a size of the barrier electrode 24 in the longitudinal direction (i.e., the horizontal direction Dh) may be formed to be larger than the sizes of the separation electrode 22 and the accumulation electrode 23.

As shown in FIG. 1, a region having the sensitivity control electrodes 21 is defined as a photoelectric converting portion D1 for receiving light to generate electric charges corresponding to the received light amount. A region having the separation electrodes 22 is defined as a charge separating portion D2 for separating undesired electric charges from the electric charges generated by the photoelectric converting portion D1 by use of a potential barrier, which is formed in under the barrier electrode 24 by applying a voltage to the barrier electrode. A region having the accumulation electrodes 23 is defined as a charge accumulating portion D3 for accumulating effective electric charges that are electric charges flowing from the charge separating portion D2 into the charge accumulating portion D3 over the potential barrier. In addition, a region including the charge holding well 14 under the end portion 25 of the connection line 26 is defined as a barrier-height adjusting portion D4 for determining the voltage applied to the barrier electrode 24 according to an electric charge amount supplied from the charge separating portion D2 to adjust a height of the potential barrier, as described later.

The sensitivity control electrodes 21 have translucency. It is desired that the separation electrodes 22, the accumulation electrodes 23, and the barrier electrode 24 do not have translucency. In the case of simultaneously forming these electrodes, all of them may have translucency. In FIG. 1, a region other than a window portion used to expose the photoelectric converting portion D1 with respect to each pixel Px is covered by a light shielding film (not shown). In the following explanation, electrons are used as the electric charges generated by the photoelectric converting portion D1. In the case of using holes as the electric charges, it is needed to reverse each of the conductive types described above and the polarities of voltages explained later.

In this embodiment, the charge holding well 14 is positioned adjacent to a center one of the three separation electrodes 22. That is, the charge holding well 14 is provided adjacent to one of the longitudinal ends of the center separation electrode 22.

In addition, an overflow drain 15 is formed as a charge discarding portion adjacent to the sensitivity control electrodes 21. For example, the overflow drain 15 can be defined as an elongate region of the second conductive type having a higher impurity concentration than the well 12. The overflow drain 15 is directly connected to a drain electrode 50 such as a contact pad not through the insulating layer 13. In the present embodiment, the drain electrodes 50 are disposed on opposite end portions of the overflow drain 50, which are electrically connected to drain electrodes (not shown) on overflow drains of adjacent pixels in a bus-wiring manner. For example, in the case of FIG. 1, the drain electrode 50 disposed on an upper end portion of the overflow drain 15 is electrically connected to the drain electrode disposed on a lower end portion of an overflow drain of an upwardly adjacent pixel, and the drain electrode 50 disposed on a lower end portion of the overflow drain 15 is electrically connected to the drain electrode disposed on an upper end portion of an overflow drain of a downwardly adjacent pixel.

In addition, both of the overflow drain 15 and the charge holding well 14 are formed at one side (i.e., the right side in FIG. 1) of the electrode arrangement in the vertical direction Dv. In addition, the well 12 formed under the center separation electrode 22 overhangs in the horizontal direction Dh, as show in FIG. 2, so that the charge holding region 14 is disposed in the well 12. On the other hand, the well 12 is not formed in a region corresponding to the overflow drain 15.

Thus, the above-described structure comprised of the photoelectric converting portion D1, the charge separating portion D2, and the charge accumulating portion D3 other than the light shielding film is substantially the same structure as a conventional FT (frame transfer)-type CCD image sensor. Therefore, by appropriately controlling voltages applied to the sensitivity control electrodes 21, the separation electrodes 22, the accumulation electrodes 23 and the barrier electrode 24, it is possible to transfer electric charges. In brief, the sensitivity control electrodes 21, the separation electrodes 22, the accumulation electrodes 23 and the barrier electrode 24 construct a vertical transfer line in the case of taking out the electric charges.

In addition, as in the case of the FT-type CCD image sensor, an accumulation region that is different from the charge accumulating portion D3 is formed to accumulate electric charges generated by an image pickup region having the arrangement of the pixels Px. Furthermore, a horizontal resistor is formed to read out the electric charges from the accumulation region, and transfer them in the horizontal direction Dh. Therefore, the accumulation region and the horizontal resistor function as the charge take-out portion. An output of the horizontal resistor is provided as a received light output.

As described above, the barrier electrode 24 is electrically connected to the charge holding well 14 through the connection line 26. The connection line 26 is formed by a metal wiring. The barrier electrode 14 has the same potential as the charge holding well 14. Therefore, when electric charges are held in the charge holding well 14, a voltage is applied to the barrier electrode 24 depending on the electric charge amount of the charge holding well 14. In other words, the barrier electrode 24 is charged depending on the electric charge amount of the charge holding well 14.

In this embodiment, when electrons are held in the charge holding well 14, a negative voltage is applied to the barrier electrode 24, so that a potential barrier formed under the barrier electrode becomes high with respect to electrons. That is, the region corresponding to the barrier electrode 24 has a higher potential height with respect to electrons than the charge separating portion D2 corresponding to the separation electrodes 22 and the charge accumulating portion D3 corresponding to the accumulation electrodes 23. Thus, the potential barrier is formed between the charge separating portion D2 and the charge accumulating portion D3. A height of the potential barrier formed under the barrier electrode 24 changes depending on the electric charge amount held in the charge holding well 14 (i.e., the barrier-height adjusting portion D4).

Potentials of the barrier electrode 24 and the charge holding well 14 are determined by the electric charge amount held in the barrier-height adjusting portion D4. On the other hand, voltages applied to the sensitivity control electrodes 21, the separation electrodes 22 and the accumulation electrodes 23 are individually controlled. For example, positive and negative voltages (+10V, −5V) are applied at appropriate timings. When one of two electric-power wirings (27a, 27b) is ohmic-connected to the sensitivity control electrodes 21, the separation electrodes 22 and the accumulation electrodes 23, it is preferred to use metal wirings as the electric-power wirings (27a, 27b). In addition, when the electric-power wirings (27a, 27b) are not connected to the sensitivity control electrodes 21, the separation electrodes 22 and the accumulation electrodes 23, these electrodes are insulated from the electric-power wirings (27a, 27b) by an insulation layer 16 such as silicon oxide or silicon nitride.

In addition, a reset gate electrode 28 is positioned adjacent to the barrier-height adjusting portion D4 in the vertical direction Dv, and a reset electrode 17 is positioned adjacent to the reset gate electrode 28. In the plan view, the reset gate electrode 28 is disposed between a reset drain formed at a region corresponding to the reset electrode 17 and the charge holding well 14 of the barrier-height adjusting portion D4. In addition, both of the reset gate electrode 28 and the reset electrode 17 are provided at one side of the barrier-height adjusting portion D4 in the vertical direction Dv. In FIG. 1, they are provided at the upper side of the barrier-height adjusting portion D4. In addition, as shown in FIG. 1, the reset electrode 17 is spaced in the horizontal direction Dh from the lowermost one of the six sensitivity control electrodes 21 in the horizontal direction Dh, i.e., the sensitivity control electrode adjacent to the uppermost one of the three separation electrodes 22. On the other hand, the reset gate electrode 28 is spaced in the horizontal direction Dh from the uppermost one of the three separation electrodes 22, i.e., the separation electrode 22 adjacent to the lowermost one of the six sensitivity control electrodes 21. The reset drain is defined as a region of the second conductive type (n++) having a high impurity concentration, and directly connected to the reset electrode 17 not through the insulating layer 13. A constant reset voltage is applied to the reset electrode 17.

In addition, a transfer gate electrode 29 is disposed in the plan view between a center one of the three separation electrode 22 and the end portion 25 of the connection line 26 positioned above the charge holding well 14. By applying an appropriate voltage to the transfer gate electrode 29, a channel is formed under the transfer gate electrode 29 to enable the movement of electric charges from the charge separating portion D2 to the barrier-height adjusting portion D4.

An operation of the photodetector of this embodiment is explained below. First, an appropriate height of the potential barrier formed under the barrier electrode 24 is determined according to an environment light condition, in which the photodetector is used. That is, after electrons in the well 12 are depleted, only the environment light is irradiated to the photodetector. At this time, a signal light needed to obtain the received light output of the photodetector is not irradiated. To obtain the electron-depleted state of the well 12, the electrons remaining in the photoelectric converting portion D1 and the charge separating portion D2 are discarded through the charge discarding portion, i.e., the overflow drain 15 having the drain electrodes 50. In addition, by applying a reset voltage to the reset gate electrode 28 to form the channel between the charge holding well 14 and the reset drain, the electrons remaining in the barrier-height adjusting portion D4 are discarded through the reset drain.

In addition, the electric charges of the charge accumulating portion D3 of a pixel Px can be discarded through the overflow drain 15 formed adjacent to the photoelectric converting portion D1 of an adjacent pixel Px in the vertical direction Dv. In FIG. 1, since the electric charges are transferred from the photoelectric converting portion D1 toward the charge accumulating portion D3, i.e., from the upper side to the lower side in the vertical direction Dv, the upper side of the pixel Px is defined the upstream side in a charge transfer direction, and the lower side of the pixel Px is defined as the downstream side in the charge transfer direction.

After the electrons in the well 12 are depleted, light (e.g., environment light) is irradiated under the condition that appropriate voltages are applied to the sensitivity control electrodes 21 of the photoelectric converting portion D1, so that amounts of electrons and holes corresponding to the received light amount are generated in the device formation layer 11 including the well 12. In this embodiment, the electrons are collected in the potential well, and the holes are discarded through the substrate 10. That is, the electrons are collected in the potential well with the amount corresponding to the received light amount. A method of controlling the voltages applied to the sensitivity control electrodes is explained later.

After the amount of electrons corresponding to the received light amount is collected (generated) in the photoelectric converting portion D1, an appropriate voltage is applied to the separation electrodes 22 in a period Ta, as shown in FIG. 4A, to form a potential well in the charge separating portion D2, and the electrons are moved from the photoelectric converting portion D1 to the charge separating portion D2. In addition, as shown in FIG. 4B, an appropriate voltage is applied to the transfer gate electrode 29 to form a channel between the charge separating portion D2 and the charge holding well 14 of the barrier-height adjusting portion D4, so that the electrons are moved from the charge separating portion D2 into the charge holding well 14.

The potential of the n++-type charge holding well 14 surrounded by the n-type well 12 is higher than the potential of the well 12. That is, the charge holding well 14 has a lower potential with respect to electrons. Thus, the potential is higher at the barrier-height adjusting portion D4 than the charge separating portion D2. Therefore, by applying the appropriate voltage to the transfer gate electrode 29 to form the channel, electrons flow from the charge separating portion D2 into the charge holding well 14 of the barrier-height adjusting portion D4.

As the electrons flow into the charge holding well 14, the potential of the charge holding well 14 lowers. That is, the potential of the barrier electrode 24 electrically connected to the charge holding well 14 lowers, as shown in FIG. 4D. As a result, a potential barrier is formed under the barrier electrode 24. Since the electrons of the charge holding well 14 move to the barrier electrode 24, the potential barrier has a height determined depending on the amount of electrons moved to the barrier electrode 24. In the case of forming a holding electrode at a position corresponding to the charge holding well 14 through the insulation layer 13, a voltage determined depending on the amount of electrons in the charge holding well 14 occurs at the holding electrode. At this time, the same voltage is applied to the barrier electrode 24 to form the potential barrier under the barrier electrode 24.

In the period Ta, no voltage is applied to the accumulation electrodes 23. Therefore, electrons are not accumulated in the charge accumulating portion D3. With respect to the timing of applying the voltage to the transfer gate electrode 29, it is possible to properly select one of a first timing control mode where the voltages are simultaneously applied to the transfer gate electrode 29 and the separation electrodes 22, as shown in FIGS. 4A and 4B, and a second timing control mode where the voltage is firstly applied to the separation electrodes 22, and then the voltage is applied to the transfer gate electrode 29.

After the electrons are moved into the barrier-height adjusting portion D4, the applying of the voltage to the transfer gate electrode 29 is stopped to hold the electrons in the charge holding well 14 in the period Tb, as shown in FIG. 4B. In addition, a voltage is applied to the drain electrode 50, as shown in FIG. 4C, so that the electrons in the charge separating portion D2 are discarded through the overflow drain 15. In the case of discarding electrons as the electric charges, the electrons can be smoothly discarded by stopping the applying of the voltage to the separation electrodes 22.

As described above, the electric charges generated at the photoelectric converting portion D1 by receiving the light (i.e., the environment light) is used to determine the height of the potential barrier formed under the barrier electrode 24. In brief, the height of the potential barrier is appropriately determined in consideration of the environment light as a disturbance component. Therefore, the above step can be regarded as a potential-height adjusting step or an ex ante adjustment step of the photodetector.

Next, a received light output of the photodetector can be obtained by a practical measurement explained below. That is, the photodetector receives a light including an intended light (i.e., signal light) and the environment light, and removes the electric charges corresponding to the environment light amount from the electric charges corresponding to the received light amount to provide a true received light output for the signal light.

Prior to the practical measurement, electrons in the well 12 except for the barrier-height adjusting portion D4 are depleted in the period Tc by use of the overflow drain 15, as shown in FIG. 4C. Thus, electrons are previously removed from the photoelectric converting portion D1 and the charge separating portion D2.

In addition, a potential barrier B1 is already formed under the barrier electrode 24, as shown in FIG. 5A. This potential barrier B1 is has an appropriate height determined according to the environment light condition in the potential-height adjusting step described above. After the photodetector receives the light including the signal light from the target space, electrons corresponding to the received light amount are collected at the photoelectric converting portion D1. Then, an appropriate voltage is applied to the separation electrodes 22 in the period Td, as shown in FIG. 4A, to form the potential well for collecting the electrons in the charge separating portion D2. By controlling the applied voltage of the sensitivity control electrodes 21, the electrons are moved from the photoelectric converting portion D1 to the charge separating portion D2, as shown in FIG. 5B.

Subsequently, an appropriate voltage is applied to the accumulation electrodes 23 in the period Te, as shown in FIG. 4E, to form a potential well in the charge accumulating portion D3. In this state, when the applying of the voltage to the separation electrodes 22 is stopped, an amount of the electrons determined by the height of the potential barrier flows from the charge separating portion D2 into the charge accumulating portion D3 over the potential barrier, as shown in FIG. 5C. On the other hand, the remaining amount of the electrons which can not flow into the charge accumulating portion D3 due to the height of the potential barrier, is kept as undesired electric charges in the charge separating portion D2, as shown in FIG. 5C. The amount of the undesired electric charges are determined according to the height of the potential barrier 24 and the size of the charge separating potion D2. Before stopping the applying of the voltage to the separation electrodes 22, the voltage applied to the sensitivity control electrodes 21 is controlled such that a potential barrier, which has a higher height than the potential barrier B1 formed under the barrier electrode 24, is formed between the charge separating portion D2 and the photoelectric converting portion D1.

According to the above operation, an appropriate amount of the undesired electric charges are separated from the electrons corresponding to the received light amount by the charge separating portion D2, and the electrons other than the undesired electrons are accumulated as effective electric charges in the charge accumulating portion D3.

After the effective electric charges are accumulated in the charge accumulating portion D3, an appropriate voltage is applied to the drain electrode 50 in the period Tf, as shown in FIG. 4C, so that the undesired electric charges in the charge separating portion D2 are discarded through the overflow drain 15. In addition, to discard the electric charges (i.e., electrons) in the barrier-height adjusting portion D4, an appropriate voltage is applied to the reset gate electrode 28 to form the channel between the charge holding well 14 and the reset drain, as shown in FIG. 4F. After the electrons are discarded from the charge holding well 14, the applying of the voltage to the reset gate electrode 28 is stopped. Then, the effective electric charges accumulated in the charge accumulating portion D3 are taken out as the received light output of the photodetector through the charge take-out portion described above.

By a series of operations described above, the received light output corresponding to an image of 1 frame is obtained. Therefore, the electrons in the charge holding well 14 are discarded at every 1 frame. Alternatively, the electrons in the charge holding well 14 may be discarded at every plural frames. In this case, since the potential barrier is continually formed under the barrier electrode 24, it becomes necessary to control the voltages applied to the separation electrodes 22 and the accumulation electrodes 23 such that electrons are movable in the vicinity of the potential barrier.

By the way, as described above, it is needed to move the electrons from the charge separating portion D2 to the barrier-height adjusting portion D4 in the barrier-height adjusting step. Since the overflow drain 15 has the function of discarding the undesired electric charges from the charge separating portion D2, the potential of the overflow drain 15 is set to be higher than the potential of the charge separating portion D2. In other words, the overflow drain 15 has a lower potential with respect to electrons.

Therefore, if the overflow drain 15 is formed at a side (e.g., the left side in FIG. 1) of the photoelectric converting portion D1, and the barrier-height adjusting portion D4 is formed at the other side (e.g., the right side in FIG. 1) of the photoelectric converting portion D1, a potential gradient is formed in the charge separating portion D2, as shown by an arrow β in FIG. 6B. This potential gradient β prevents a smooth movement of electrons from the charge separating portion D2 toward the barrier-height adjusting portion D4. In FIG. 6B, a dashed line shows a potential gradient formed at the time of moving the electrons into the barrier-height adjusting portion D4 by applying a voltage to the transfer gate 29.

On the contrary, according to this embodiment, since both of the overflow drain 15 and the barrier-height adjusting portion D4 are disposed at one side (e.g., the right side in FIG. 1) of the photoelectric converting portion D1, a potential gradient is formed in the charge separating portion D2, as shown by an arrow α in FIG. 6A. This potential gradient α facilitates the smooth movement of electrons from the charge separating portion D2 toward the barrier-height adjusting portion D4. Thus, since the electrons are efficiently moved from the charge separating portion D2 into the barrier-height adjusting portion D4, it is possible to accurately determine the height of the potential barrier formed between the charge separating portion D2 and the charge accumulating portion D3.

(Spatial Information Detecting Device)

As described above, the photodetector of this embodiment is used in the distance measuring device for determining a distance to the object in the target space as the spatial information. That is, as shown in FIG. 7, the distance measuring device is an active-type distance measuring device, which is mainly formed with a light emission source 2 for projecting light into the target space, the above-explained photodetector 1 for receiving the light from the target space, a signal processing portion 3 for determining the distance to an object 5 in the target space according to the received light output of the photodetector, and a control portion 4 for controlling operations of the photodetector 1 and the light emission source 2. The control portion 4 also controls the timing of performing calculations in the signal processing portion 3.

The light emission source 2 can be formed by arranging plural infrared light emitting diodes. The light provided from the target space, i.e., a reflected light from the object 5 is incident on the photodetector 1 through an infrared pass filter. In the case of using the infrared light as the light for measuring the distance, it is possible to suppress the incident of visible light on the photodetector 1 by the infrared pass filter.

The signal processing portion 3 and the control portion 4 can be formed by a microcomputer for executing appropriate programs.

To measure the distance, an intensity-modulated light is projected from the light emission source 2 into the target space, and then reflected by the object 5 in the target space, so that the reflected light is incident on the photodetector 1. A phase difference between the phase of the reflected light incident on the photodetector 1 and the phase of the light emitted from the light emission source 2 is determined, and then converted into the distance to the object 5.

Figure 8A:
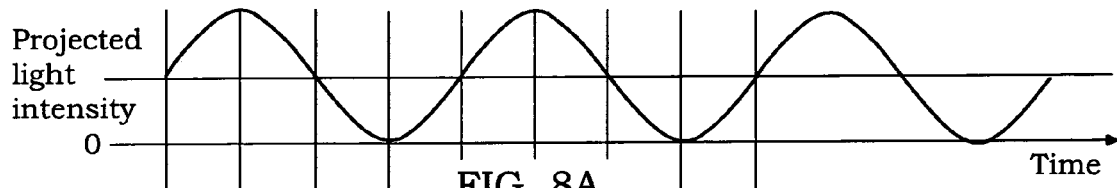
FIGS. 8A and 8B are operation explanatory diagrams of the spatial information detecting device.
Figure 8B:
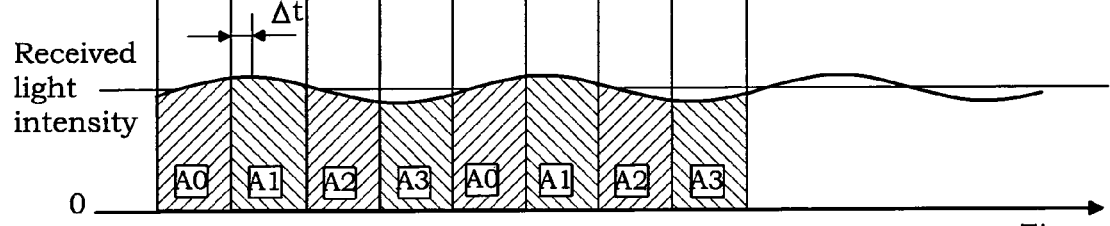

For example, when an intensity modulated light shown in FIG. 8A is projected from the light emission source 2 into the target space, and the intensity of the light incident on one pixel Px of the photodetector 1 changes, as shown in FIG. 8B, the distance L to the object 5 in the target space is reflected in a time difference Δt (s) between the projected light and the received light.

Therefore, the distance L to the object 5 is expressed by the following equation:

$$L = c \cdot \Delta t / 2,$$

where c is the speed of light (m/s). In addition, when a frequency of a modulation signal used to generate the intensity-modulated light is f (Hz), and the phase difference is φ (rad), the time difference Δt is expressed by the following equation:

$$\Delta t = \phi / 2\pi \cdot f.$$

Thus, the distance L can be determined by use of the phase difference φ.

This phase difference φ can be regarded as the phase difference between the modulation signal for driving the light emission source 2 and the incident light on each of the pixels Px of the photodetector 1. Therefore, when the received light intensity of the incident light on the photodetector 1 is determined with respect to difference phases of the modulation signal, it is considered to determine the phase difference φ between the incident light and the modulation signal according to the resultant relation between the phase and the received light intensity.

In the fact, the received light amount is detected at every phase zone having a predetermined phase width (time width) by the photodetector 1, and a received light output corresponding to this received light amount is used to calculate the phase difference φ. Specifically, when each of the phase zones has the phase width of 90 degrees, four phase zones are obtained every one period of the modulation signal. For example, the received light amounts obtained at the four phase zones (i.e., 0 to 90 degrees, 90 to 180 degrees, 180 to 270 degrees, and 270 to 360 degrees) are respectively defined as A0, A1, A2 and A3, as shown by hatching areas in FIG. 8B. In this case, the phase difference φ is expressed by the following equation:

$$\phi = \tan^{-1}\{(A0-A2)/(A1-A3)\}.$$

The correspondence between the phase zone of the modulation signal and the received light amount is not limited to the above case. The phase width of the phase zone can be appropriately set. For example, the phase zone may have the phase width of 180 degrees. Depending on the correspondence therebetween, the sign of the phase difference φ changes.

To perform the above calculation, it is needed to generate electrons corresponding to the received light amount in each of the phase zones of the modulation signal by the photoelectric converting portion D1 of the photodetector 1. To obtain the received light amount in each of the phase zones, the voltage applied to the photosensitivity control electrodes 21 are controlled in synchronization with the modulation signal.

The control portion 4 has the capability of controlling the applying of the voltage to each of the sensitivity control electrodes 21. The potential well is formed under the sensitivity control electrode(s) 21, to which the voltage is applied. That is, by controlling the number of the sensitivity control electrodes 21, to which the voltage is applied, it is possible to obtain the potential well having a desired aperture area in the photoelectric converting portion D1. Thus, the photoelectric converting portion D1 has the sensitivity control function.

The electrons generated by the photoelectric converting portion D1 are collected in the potential well. Therefore, as the potential well has a larger aperture area (i.e., a larger volume), the efficiency of collecting the electrons increases. On the contrary, when the voltage is applied to the single sensitivity control electrode 21, the efficiency of collecting the electrons lowers. In other word, when the voltage is applied to the single sensitivity control electrode 21, the electrons collected in the potential well 21 considerably decrease. Therefore, in a charge collection period where the voltage is applied to the plurality of the sensitivity control electrodes 21, electrons can be efficiently collected in the potential well having a large aperture area. Subsequently, in a charge holding period where the voltage is applied to a reduced number of the sensitivity control electrodes 21, e.g., the single sensitivity control electrode 21, it is possible to hold the electrons collected in the charge collection period. In the case of collecting and holding the electrons according to the above-described procedures, since the amount of electrons collected in the charge holding period is very small, the electrons held in the charge holding period substantially reflect the received light amount obtained in the charge collection period. In addition, when the sensitivity control electrode 21 used to form the potential well for holding the electrons in the charge holding period is light shielded, it is possible to further suppress the collection of electrons in the charge holding period.

As clearly understood from the above operations, when it is needed to collect the electrons corresponding to the received light amount in a specific phase zone of the modulation signal by the photoelectric converting portion D1, the number of the sensitivity control electrodes 21, to which the voltage is applied in the charge collection period, is increased, and on the other hand, the number of the sensitivity control electrodes 21, to which the voltage is applied in the charge holding period, is decreased. In the charge holding period, it is particularly preferred that the voltage is applied to the single photosensitivity control electrode 21. The control portion 4 changes the voltage applying pattern to the sensitivity control electrode(s) 21 at every period of the modulation signal. That is, the control portion 4 applies the voltage to the plural sensitivity control electrodes 21 at every specific phase zone of the modulation signal to collect the electrons generated in the specific phase zone over plural periods of the modulation signal. In this case, even when the received light amount obtained in the specific phase zone of one period of the modulation signal is small, it is possible to obtain a sufficient received light amount by collecting the electrons generated in the specific phase zone over the plural periods of the modulation signal. On the other hand, when the received light amount is sufficiently large, saturation may be caused by collecting the electrons over the plural periods of the modulation signal. In such a case, the applying of the voltage to the photosensitivity control electrodes 21 is appropriately controlled according to the use environment.

In the signal processing portion 3, the received light output corresponding to each of the phase zones with respect to each of the pixels Px is used to determine the above-mentioned phase difference. That is, it is possible to obtain a distance image where a pixel value of each pixel Px provides a distance.

By the way, to measure the distance according to the above-described principle, it is ideal to detect only the signal light projected from the light emission source 2 into the target space by the photodetector 1. In this case, as the received light amount of the signal light increases, the measurement accuracy of the distance becomes higher. However, in most cases, the environment light is also incident on the photodetector 1. When a total light amount of the environment light and the signal light exceeds an upper limit of the photoelectric converting capability of the photodetector 1, the generation amount of the electric charges are saturated, so that the measurement accuracy deteriorates. Therefore, to improve the operation reliability of the photodetector irrespective of the use environment, it is desired to prevent the saturation of the photodetector 1, and increase the electric charge amount corresponding to the signal light.

As described above, the photodetector 1 of the present invention has the capability of discarding the undesired electric charges corresponding to the environment light, the amount of which is determined according to the electric charge amount in the barrier-height adjusting portion D4. That is, when the height of the potential barrier formed under the barrier electrode 24 is determined according to the received light amount of only the environment light, the undesired electric charges corresponding to the environment light can be separated by the charge separating portion D2. As a result, it is possible to increase a ratio of the effective electrons corresponding to the received light amount of only the signal light, which are accumulated in the charge accumulating portion D3, relative to the electrons corresponding to the received light amount of both of the signal light and the environment light, which are generated by the photoelectric converting portion D1. In addition, since the undesired electric charges are discarded through the overflow drain 15 as the charge discarding portion, it is possible to prevent that the electrons accumulated in the charge accumulating portion D3 are saturated.

From the above reasons, in the present embodiment, the intensity-modulated light is intermittently projected from the light emission source 2 in the target space such that a lighting period where the intensity-modulated light is projected into the target space and a rest period where no light is projected from the light emission source are alternately repeated. By supplying the electrons generated by the photoelectric converting portion D1 in the rest period into the barrier-height adjusting portion D4, the height of the potential barrier is associated with the amount of the undesired electric charges (i.e., electrons) corresponding to the environment light.

On the other hand, in the lighting period, since the potential barrier having the height determined according to the received light amount obtained in the rest period is formed under the barrier electrode 24, the undesired electrons corresponding to the environment light are separated from the electrons generated in the lighting period by the charge separating portion D2, and the remaining electrons (i.e., the effective electrons) flows into the charge accumulating portion D3 over the potential barrier, and then are accumulated therein. Therefore, even when the environment light fluctuates, and the amount of the undesired electric charges substantially changes with the received light amount of the environment light, it is possible to stably accumulate a sufficient amount of the effective electric charges corresponding to the signal light in the charge accumulating portion D3. In brief, by separating the undesired electric charges from the electric charges generated in the lighting period by the photoelectric converting portion D1, it is possible to increase the signal-to-noise ratio.

As described above, when the amount of electrons generated in one period of the modulation signal by the photoelectric converting portion D1 is small, the electrons may be collected over plural periods of the modulation signal by the photoelectric converting portion D1. However, electrons may be saturated in the photoelectric converting portion D1. In such a case, it is preferred that the operation of separating (weighing) the undesired electric charges is performed plural times by the charge separating portion D2 to accumulate a sufficient amount of the effective electric charges in the charge accumulating portion D3. Then, the effective electrons accumulated in the charge accumulating portion D3 over the plural times are taken out as the received light output.

The electrons accumulated in the charge accumulating portion D3 correspond to the electrons obtained by removing the undesired electrons from the electrons generated by the photoelectric converting portion D1. Therefore, as compared with the case of accumulating the electrons generated by the photoelectric converting portion D1 directly in the charge accumulating portion D3, it is possible to remarkably reduce the occurrence of the saturation. In addition, since the S/N ratio is increased, an improvement in measurement accuracy of distance can be achieved.

In the control portion 4, after the electrons flow into the charge accumulating portion D3, the undesired electric charges are discarded from the charge separating portion D2 through the overflow drain 15. This operation is performed at every time of moving the electrons into the charge accumulating portion D3. In addition, when it is needed to update the electric charge amount in the barrier-height adjusting portion D4, an appropriate voltage is applied to the reset gate electrode 28 to discard the electric charges from the charge holding well 14 through the reset drain. The timing of discarding the electric charges from the charge holding well 14 can be appropriately determined according to the use environment such as the fluctuation timing of the environment light. Alternatively, the operation of discarding the electric charges from the charge holding well 14 may be performed at every time of taking out the received light output. That is, the height of the potential barrier can be adjusted every frame of the distance image.

As described above, the undesired electric charges are discarded at every time of moving the electric charges into the charge accumulating portion D3. In addition, when the electrons generated in the rest period by the photoelectric converting portion D1 is supplied from the charge separating portion D2 into the barrier-height adjusting portion D4, there is possibility that a part of the electrons remain in the charge separating portion D2. Therefore, it is preferred to discard the electrons in the charge separating portion D2 through the overflow drain 15 prior to the lighting period.

Second Embodiment

A photodetector of the second embodiment is characterized in that the overflow drain 15 (i.e., the charge discarding portion) has a function of discarding excess electric charges generated by the photoelectric converting portion D1 when the received light amount is excessively increased, as well as the function of discarding the undesired electric charges separated by the charge separating portion D2. When the excess electric charges are not discarded, a leakage of the excess electric charges into another pixel Px, which is a so-called blooming phenomenon, may occur.

By the way, when the overflow drain 15 is formed, as in the case of the first embodiment, there is a possibility that electric charges other than the excess electric charges are lost from the photoelectric converting portion D1 at the time of discarding the undesired electric charges from the charge separating portion D2. For example, when the undesired electric charges are discarded in the period of collecting the electric charges in the photoelectric converting portion D1 by controlling the voltage applied to the sensitivity control electrodes 21, there is a fear that a mismatch occurs between the electric charge amount collected in the photoelectric converting portion D1 and the received light amount, so that the received light output cannot be obtained accurately.

Figure 9:
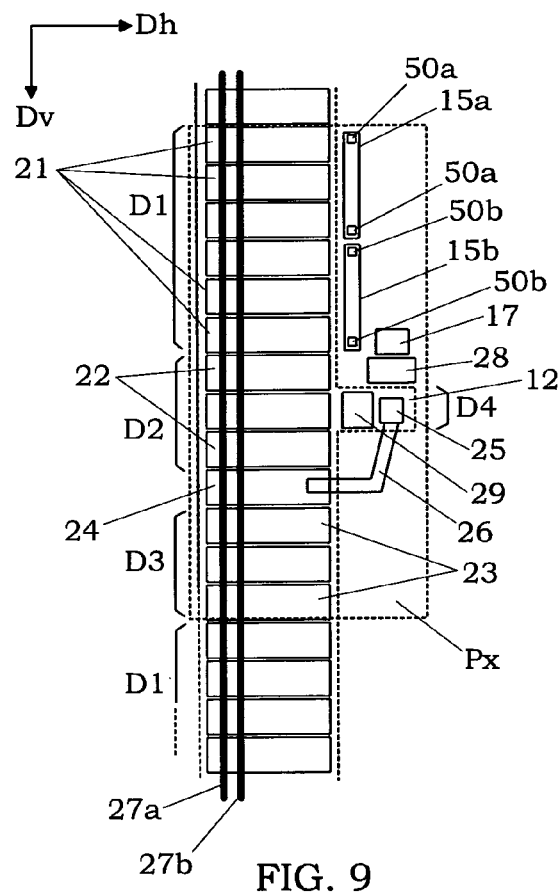
FIG. 9 is a plan view of a relevant portion of a photodetector according to a second embodiment of the present invention.

In the present embodiment, as shown in FIG. 9, a first overflow drain 15a for discarding the excess electric charges of the photoelectric converting portion D1 is formed as a first charge discarding portion adjacent to the sensitivity control electrodes 21 at a position spaced from the charge separating portion D2, and a second overflow drain 15b for discarding the undesired electric charges of the charge separating portion D2 is formed as a second charge discarding portion adjacent to the sensitivity control electrodes 21 at a position close to the charge separating portion D2. In addition, first drain electrodes 50a such as contact pads are disposed on opposite end portions of the first overflow drain 15a, and second drain electrodes 50b such as contact pads are disposed on opposite end portions of the second overflow drain 15b. As in the case of the first embodiment, the first drain electrodes 50a are electrically connected to the first drain electrodes (not shown) of the first overflow drains of adjacent pixels in a bus-wiring manner. Similarly, the second drain electrodes 50b are electrically connected to the second drain electrodes (not shown) of the second overflow drains of adjacent pixels in a bus-wiring manner.

In this case, it is possible to determine the timing of discarding the excess electric charges independently from timing of discarding the undesired electric charges, and control the potential in each of the overflow drains (15a, 15b). Other configurations and operations are the same as those in the first embodiment, and therefore duplicate explanations are omitted.

Third Embodiment

A photodetector of the third embodiment is characterized in that a pair of slit regions 32 are formed so as to straddle between the barrier electrode 24 and an adjacent separation electrode 22 in the well 12, as shown in FIG. 10. In addition, the slit regions 32 are spaced from each other in the horizontal direction Dh. That is, one of the slit regions 32 is formed in the vicinity of one ends of the barrier electrode 24 and the adjacent separation electrode 22, and the other slit region 32 is formed in the vicinity of the opposite ends of the barrier electrode 24 and the adjacent separation electrode 22. For example, each of the slit regions 32 is formed in the conductive type of n+, which has a higher impurity concentration than the n-type well 12, by means of ion implantation.

When the slit regions 32 are not formed, the potential gently changes at the boundary portion of the well 12. In other words, the boundary portion of the well 12 has a gentle rising edge of the potential, as shown in FIG. 11B. On the other hand, when the slit regions 32 are formed, as described above, the potential rapidly changes at the boundary portion of the well 12. In other words, the boundary portion of the well 12 has a sharp rising edge of the potential, as shown in FIG. 11A. Therefore, the boundary portion of the potential barrier formed under the barrier electrode 24 also become to have the sharp rising edge of the potential. As a result, it is possible to reduce undesired leakage of the electric charges from the charge separating portion D2 into the charge accumulating region D3. In brief, by alleviating a nonlinear relation between the voltage applied to the barrier electrode 24 and the amount of the undesired electric charges separated by the charge separating portion D2 (i.e., the volume of the potential barrier has tertiary characteristics with respect to the voltage applied to the barrier electrode 24.), it is possible to obtain a substantially proportional relation between the electric charge amount of the barrier-height adjusting portion D4 and the amount of the undesired electric charges.

The configuration of the present embodiment is also available in the first embodiment. Other configurations and operations are the same as those in the second embodiment, and therefore duplicate explanations are omitted.

Fourth Embodiment

A photodetector of the fourth embodiment is characterized in that a p-type barrier layer 33 is formed in the well 12 at a position under the charge holding well 14, as shown in FIG. 12. By forming the barrier layer 33, it is possible to prevent that electric charges generated at a deep portion in the substrate 10 or the device forming layer 11 by light irradiation move into the charge holding well 14. That is, since noise electric charges provided from a region other than the charge separating portion D2 are not mixed into the charge holding well 14 of the barrier-height adjusting portion D4, the potential barrier accurately can be formed under the barrier electrode 24 according to the electric charge amount supplied from the charge separating portion D2.

In addition, in the present embodiment, a potential adjusting portion 34 of n+ type, which has a higher impurity concentration than the well 12, is formed in the well 12 at a position close to the charge holding well 14 under the transfer gate electrode 29. This potential adjusting portion 34 can be formed by means of ion implantation or the like. The potential adjusting portion 34 has a lower potential with respect to electrons than the well 12.

Therefore, when a channel is formed between the charge separating portion D2 and the barrier-height adjusting portion D4 by applying an appropriate voltage to the transfer gate electrode 29, a potential gradient develops in a direction of facilitating the movement of electrons from the charge separating portion D2 toward the barrier-height adjusting portion D4. By help of the potential gradient, electrons can be efficiently supplied from the charge separating portion D2 into the barrier-height adjusting portion D4. When the potential adjusting portion 34 is not formed, a boss M1 showing a rising of the potential may occurs at a region between the transfer gate electrode 29 and the charge holding well 14, as shown in FIG. 13B. On the contrary, by appropriately forming the potential adjusting portion 34, the boss M1 can be prevented from occurring, as shown in FIG. 13A.

The configuration of the present embodiment is also available in the first embodiment. Other configurations and operations are the same as those in the second embodiment, and therefore duplicate explanations are omitted.

Fifth Embodiment

A photodetector of the fifth embodiment is characterized in that a buffer electrode 35 is formed on the general surface of the well 12 and between he barrier electrode 24 and the accumulation electrode 23, as shown in FIG. 14. A constant voltage is applied to the buffer electrode 35 such that a region under the buffer electrode 35 has a lower potential with respect to electrons than the region under the barrier electrode 24, and also a higher potential with respect to electrons than the region under the accumulation electrode 23.

In the case of not forming the buffer electrode 35, when electrons are accumulated in the charge accumulating portion D3 (i.e., the region under the accumulation electrode 23), the height of the potential barrier B1 formed under the barrier electrode 24 may change depending on the accumulation amount of electrons. For example, as the accumulation amount of electrons increases, the height of the potential barrier B1 may become higher, as shown by the dotted line in FIG. 15B. In this case, there is a possibility that the amount of the undesired electric charges separated by the charge separating portion D2 fluctuates depending on the electric charge amount accumulated in the charge accumulating portion D3.

On the other hand, in the present embodiment, when the buffer electrode is formed, and the voltage applied to the buffer electrode 35 is controlled, as described above, it is possible to reduce the change in height of the potential barrier B1 caused by the fluctuation of the accumulation amount of electrons in the charge accumulating portion D3, as show in FIG. 15A. As a result, the undesired electric charges can be stably weighed and separated by use of the potential barrier B1, and the effective electric charges can be accurately accumulated in the charge accumulating portion D3.

The configuration of the present embodiment is also available in the first embodiment. Other configurations and operations are the same as those in the second embodiment, and therefore duplicate explanations are omitted.

In the above embodiments, it was explained about the case where the electric charges generated by the photoelectric converting portion to adjust the height of the potential barrier are indirectly supplied into the barrier-height adjusting portion through the charge separating portion in consideration of the positional relation between the photoelectric converting portion and the charge discarding portion. Alternatively, another layout of directly supplying the electric charges from the photoelectric converting portion into the barrier-height adjusting portion may be used.

In the above embodiments, the amount of the undesired electric charges is determined by adjusting the height of the potential barrier formed under the barrier electrode 24. Alternatively, the amount of the undesired electric charges can be controlled by changing the potential of the charge separating portion D2 formed under the separation electrode(s) 22.

INDUSTRIAL APPLICABILITY

As understood from the above embodiments, according to the present invention, since the height of the potential barrier is determined according to an electric charge amount supplied from the photoelectric converting portion into the barrier-height adjusting portion preferably through the charge separating portion, it is possible to appropriately control the amount of the undesired electric charges to be separated depending upon the environment light condition. In addition, since the undesired electric charges can be discarded from the charge separating portion at an appropriate timing by the charge discarding portion, it is possible to reliably carry out the removing operation of the undesired electric charges from the electric charges generated at the photoelectric converting portion by the charge separating portion. Thus, the photodetector of the present invention has the capability of stably obtaining a wide dynamic range for input signals. Furthermore, when the photo detector of the present invention is utilized in the spatial information detecting device, the spatial information can be accurately detected from the target space even under a condition that the environment light fluctuates with time.

Therefore, the photodetector of the present invention and the spatial information detecting device using the same photodetector are expected to be utilized in various application fields such as crime-prevention system and factory automation system.

The invention claimed is:

1. A photodetector comprising:
   a semiconductor substrate;
   a photoelectric converting portion formed in said semiconductor substrate to generate electric charges corresponding to a received light amount;
   a charge separating portion having a separation electrode formed on a general surface of said semiconductor substrate;
   a charge accumulating portion having an accumulation electrode formed on the general surface of said semiconductor substrate;
   a barrier electrode formed on the general surface of said semiconductor substrate between said separation electrode and said accumulation electrode;
   a barrier-height adjusting portion electrically connected to said barrier electrode; and
   a charge discarding portion;
   wherein said charge separating portion is configured to separate undesired electric charges from the electric charges generated by said photoelectric converting portion by use of a potential barrier, which is formed in said semiconductor substrate under said barrier electrode by applying a voltage to said barrier electrode,
   said barrier-height adjusting portion determines the voltage applied to said barrier electrode according to an electric charge amount supplied from said photoelectric converting portion to adjust a height of said potential barrier, the electric charge amount supplied from said photoelectric converting portion based upon an amount of light received;
   said charge accumulating portion is configured to accumulate effective electric charges that are electric charges flowing from said charge separating portion into said charge accumulating portion over said potential barrier,
   said charge discarding portion is configured to discard the undesired electric charges separated by said charge separating portion, and
   the effective electric charges accumulated in said charge accumulating portion are provided as an output of the photodetector,
   wherein said barrier electrode is formed on said semiconductor substrate through an insulating layer,
   said photoelectric converting portion, said charge separating portion, said barrier electrode and said charge accumulating portion are aligned in a row, and
   said barrier-height adjusting portion and said charge discarding portion are provided at one side of said row such that said barrier-height adjusting portion is positioned adjacent to said charge separating portion, and said charge discarding portion is positioned adjacent to said photoelectric converting portion.

2. The photodetector as set forth in claim 1, wherein said barrier-height adjusting portion determines the voltage applied to said barrier electrode according to the electric charge amount supplied from said photoelectric converting portion through said charge separating portion.

3. The photodetector as set forth in claim 1, wherein said photoelectric converting portion comprises a plurality of sensitivity control electrodes formed on the general surface of said semiconductor substrate, and a potential well having a desired aperture area is formed in said semiconductor substrate by controlling a voltage applied to each of said sensitivity control electrodes.

4. The photodetector as set forth in claim 1, comprises a pair of slit regions formed in said semiconductor substrate so as to straddle between said separation electrode and said barrier electrode, and spaced from each other in a direction orthogonal to said row, and
said slit regions have a same conductive type as another region other than said slit regions, which straddles between said separation electrode and said barrier electrode, and have a higher impurity concentration than said another region.

5. The photodetector as set forth in claim 1, further comprising a buffer electrode formed on the general surface of said semiconductor substrate between said barrier electrode and said accumulation electrode, and a voltage applied to said buffer electrode is controlled such that a potential developed in said semiconductor substrate under said buffer electrode is between a potential developed in said semiconductor substrate under said barrier electrode and a potential developed in said semiconductor substrate under said accumulation electrode.

6. The photodetector as set forth in claim 1, further comprising a barrier layer formed in said semiconductor substrate under said barrier-height adjusting portion to block a movement of electric charges from a deep portion of said semiconductor substrate into said barrier-height adjusting portion.

7. The photodetector as set forth in claim 1, further comprising a transfer gate electrode formed on the general surface of said semiconductor substrate between said charge separating portion and said barrier-height adjusting portion, and a potential adjusting portion formed adjacent to said barrier-height adjusting portion,
a charge transfer channel is formed in said semiconductor substrate under said transfer gate electrode and between said charge separating portion and said barrier-height adjusting portion by controlling a voltage applied to said transfer gate electrode, and
said potential adjusting portion has an impurity concentration controlled such that electric charges move in said charge transfer channel from said charge separating portion toward said barrier-height adjusting portion.

8. The photodetector as set forth in claim 1, wherein said charge discarding portion is located in the vicinity of said photoelectric converting region and said charge separation region to discard excess electric charges from said photoelectric converting portion as well as the undesired electric charges from said charge separation region.

9. The photodetector as set forth in claim 8, wherein said charge discarding portion comprises a first charge discarding portion configured to discard the excess electric charges, and a second charge discarding portion configured to discard the undesired electric charges.

10. The photodetector as set forth in claim 9, wherein said charge discarding portion is configured to discard the excess electric charges from said photoelectric converting portion through said first charge discarding portion at a first time and is configured to discharge the undesired electric charges from said charge separating portion through said second charge discarding portion at a second time, wherein the first time is different from the second time.

11. The photodetector as set forth in claim 1, wherein a plurality of pixels are formed on said semiconductor substrate, each of which comprises said photoelectric converting portion, said charge separating portion, said charge accumulating portion, said barrier-height adjusting portion and said barrier electrode.

12. A spatial information detecting device comprising:
a light emission source configured to intermittently project light into a target space;
the photodetector as set forth in of claim 1, which is disposed to receive light from said target space;
a control portion configured to control light emission of said light emission source, and voltages applied to said separation electrode, said accumulation electrode and said charge discarding portion of the photodetector; and
a signal processing portion configured to extract spatial information of said target space from an output of the photodetector;
wherein said control portion moves electric charges, which are generated by said photoelectric converting portion within a rest period where the light is not projected from said light emission source to said target space, into said barrier height adjusting portion to form said potential barrier with a height determined according to the electric charge amount in said barrier height adjusting portion, the electric charge amount supplied from said photoelectric converting portion based upon an amount of light received,
said charge separating portion removes the undesired electric charges from electric charges, which are generated by said photoelectric converting portion within a lighting period where the light is projected from said light emission source into said target space,
the electric charges flowing from said charge separating portion into said charge accumulating portion over said potential barrier are accumulated as the effective electric charges in said charge accumulating portion,
the undesired electric charges separated by said charge separating portion are discarded through said charge discarding portion prior to said rest period, and
the effective electric charges accumulated in said charge accumulating portion are provided as the output of the photodetector.

13. The spatial information detecting device as set forth in claim 12, wherein said photoelectric converting portion has a plurality of sensitivity control electrodes on the general surface of said semiconductor substrate,
said control portion sends a modulation signal to said light emission source such that light intensity-modulated at the modulation signal is projected into said target space within said lighting period, and controls voltages applied to said sensitivity control electrodes such that an aperture area of a potential well formed in said semiconductor substrate under each of said sensitivity control electrodes changes at a timing synchronized with the modulation signal, thereby generating the electric charges corresponding to a phase zone of the modulation signal by said photoelectric converting portion, and
said signal processing portion detects a distance to an object in said target space as the spatial information from outputs of the photodetector, which are obtained at plural phase zones of the modulation signal.

* * * * *